United States Patent
Yoon et al.

(10) Patent No.: US 10,115,443 B2
(45) Date of Patent: Oct. 30, 2018

(54) TECHNIQUES TO IMPROVE SWITCHING PROBABILITY AND SWITCHING SPEED IN SOT DEVICES

(71) Applicant: National University of Singapore, Singapore (SG)

(72) Inventors: Jungbum Yoon, Singapore (SG); Jae Hyun Kwon, Singapore (SG); Hyunsoo Yang, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 15/458,196

(22) Filed: Mar. 14, 2017

(65) Prior Publication Data

US 2017/0270986 A1    Sep. 21, 2017

(30) Foreign Application Priority Data

Mar. 15, 2016    (SG) .............................. 10201601988Q

(51) Int. Cl.
| | |
|---|---|
| *G11C 11/16* | (2006.01) |
| *H01F 10/08* | (2006.01) |
| *H01L 43/10* | (2006.01) |
| *H01L 43/08* | (2006.01) |

(52) U.S. Cl.
CPC .......... *G11C 11/165* (2013.01); *G11C 11/161* (2013.01); *H01F 10/08* (2013.01); *H01L 43/08* (2013.01); *H01L 43/10* (2013.01)

(58) Field of Classification Search
CPC .................................................. G11C 11/161
USPC ....................................................... 365/171
See application file for complete search history.

(56) References Cited

U.S. PATENT DOCUMENTS

| | | | |
|---|---|---|---|
| 2016/0225424 A1 | 8/2016 | Qiu et al. | |
| 2017/0229160 A1* | 8/2017 | Ma | G11C 11/161 |

FOREIGN PATENT DOCUMENTS

| | | |
|---|---|---|
| EP | 2073210 A1 | 6/2009 |
| WO | WO-2012068309 A2 | 5/2012 |

OTHER PUBLICATIONS

Cubukcu, Murat, et al., "Ultra-fast Magnetization Reversal of a Three-terminal Perpendicular Magnetic Tunnel Junction by Spin-Orbit Torque," Materials Science, Submission date Sep. 8, 2015, pp. 1-23.
Garello, Kevin, et al., "Ultrafast Magnetization Switching by Spin-orbit Torques," AIP Publishing. LLC, Applied Physics Letters, vol. 105, Issue 21, Nov. 2014, pp. 1-5.

* cited by examiner

*Primary Examiner* — Jason Lappas
(74) *Attorney, Agent, or Firm* — Cesari and McKenna, LLP; James A. Blanchette

(57) ABSTRACT

In one embodiment, a desirable (e.g., substantially 100%) SOT switching probability is achieved in a SOT device by applying in-plane input current as one or more pulses having a tuned pulse width. In the case of a single pulse, pulse width may be selected as a single tuned pulse width or a range of pulse widths that avoid a specific pulse width determined to cause a switch-back response. In the case of multiple pulses, pulse width, a time interval between pulses and other factors such as intensities may be selected to prevent a switch-back response. Further, SOT switching speed may be achieved by reducing incubation delay through modification of an external magnetic field or input current density applied to the SOT device.

13 Claims, 32 Drawing Sheets

TECHNIQUES TO IMPROVE SWITCHING PROBABILITY AND SWITCHING SPEED IN SOT DEVICES

RELATED APPLICATIONS

The present application claims priority to Singapore Patent Application No. 10201601988Q, titled Techniques to Improve Switching Probability and Switching Speed in Spin Orbit Transfer Devices, filed Mar. 15, 2016 by Applicant National University of Singapore, the contents of which are incorporated by reference herein in their entirety.

BACKGROUND

Technical Field

The present disclosure relates generally to magnetization manipulation in spintronic devices, and more specifically to techniques for improving switching probability and speed in spin orbit spin transfer torque devices.

Background Information

In modern spintronic devices, such as information storage devices (e.g., disks and random access memory), the magnetization directions of ferromagnets (FMs) are utilized to write, store and retrieve information. Effectively manipulating the magnetization direction, e.g. switching the magnetization direction via interactions between spins and charges, is important to the operation of such devices. Traditionally, magnetization manipulation has been achieved via current-induced spin transfer torque (STT) that requires a ferromagnetic spin polarizer in a spin valve or magnetic tunnel junction structure. More recently, techniques have been developed for magnetization manipulation that utilize spin-orbit spin transfer torque (SO-STT). A typical SO-STT device (which may simply be referred to as a spin orbit torque (SOT) device) is structured as a multilayer stack including an FM layer adjacent to a heavy metal (HM) layer, among other layers. When an in-plane input current is applied to the SOT device, a spin current from the adjacent HM layer diffuses into the FM layer and influences the magnetization direction of the FM. Such influence may be used to reverse the magnetization direction effectively "switching" the SOT device. Use of such SOT switching may provide a variety of advantages over traditional STT switching in information storage devices.

While SOT switching is a powerful technique, it may be challenging to design devices in which a desirable (e.g., 100%) SOT switching probability is achieved, where SOT switching probability refers to the probability the magnetization direction of the SOT device is reversed, and stays reversed, when an input current is applied. Further, it may be challenging to design devices that achieve a desired level of SOT switching speed.

SUMMARY

A desirable (e.g., substantially 100%) SOT switching probability may be achieved in a SOT device by applying in-plane input current as one or more pulses having a tuned pulse width. In the case of a single pulse, pulse width may be selected as a single tuned pulse width or a range of pulse widths that avoid a specific pulse width determined to cause a switch-back response. In the case of multiple pulses, pulse width, a time interval between pulses and other factors such as intensities may be selected to prevent a switch-back response. Further, SOT switching speed may be achieved by reducing incubation delay through modification of an external magnetic field or input current density applied to the SOT device.

In a first embodiment, magnetization direction of a FM layer of a SOT device is switched at a desirable (e.g., substantially 100%) SOT switching probability by applying an in-plane assist field, and applying one or more in-plane input current pulses each having a tuned pulse width or a pulse width selected to be within a range of tuned pulse widths. The tuned pulse width or range of tuned pulse widths are selected to avoid a specific pulse width that causes switch-back of the magnetization direction of the FM layer of the SOT device. The specific pulse width may be determined by physically testing the SOT device for each of a plurality of different pulse widths or simulating the SOT device for each of the plurality of different pulse widths.

In a second embodiment, magnetization direction of a FM layer of a SOT device is switched at a desirable (e.g., substantially 100%) SOT switching probability by applying an in-plane assist field, applying an in-plane input current pulse having a first tuned pulse width and a first intensity to switch the magnetization direction of the FM layer, waiting for a time interval, and applying a subsequent in-plane input current pulse having a second tuned pulse width and a second intensity to prevent switchback of the magnetization direction of the FM layer. The tuned pulse width, time interval between pulses, and other factors may be adjusted to prevent switching-back response.

In a third embodiment, a spin orbit torque (SOT) device may be produced having a ferromagnetic (FM) layer whose magnetization direction is switched at a desirable (e.g., substantially 100%) SOT switching probability by determining operation (e.g., by physical testing or simulation) in response to in-plane input current pulses having a plurality of different pulse widths, identifying a specific pulse width that causes switch-back of the magnetization direction of the FM layer of the SOT device, selecting a tuned pulse width or a tuned range of pulse widths that avoid the specific pulse width that causes switch-back of the magnetization direction of the FM layer of the SOT device; and finally producing the SOT device to use in-plane input current pulses having the tuned pulse width or a pulse width selected to be within the range of tuned pulse widths to switch the magnetization direction of the FM layer.

It should be understood that a variety of additional features and alternative embodiments may be implemented other than those discussed in this Summary. This Summary is intended simply as a brief introduction to the reader, and does not indicate or imply that the examples mentioned herein cover all aspects of the disclosure, or are necessary or essential aspects of the disclosure.

BRIEF DESCRIPTION OF THE DRAWINGS

The description below refers to the accompanying drawings of example embodiments, of which.

DETAILED DESCRIPTION OF EXAMPLE EMBODIMENTS

The magnetization switching process in the FM layer of a SOT device can be controlled by adjusting the width of one or more pulses applied as an input current. Depending on the pulse width, the magnetization direction of the FM of the SOT device may fully switch or switch back. By utilizing a process to tune the pulse width, a desirable (e.g., substantially 100%) SOT switching probability (i.e. the probability that magnetization direction is reversed and stays reversed when an input current is applied) may be achieved, enabling production of a reliable SOT device.

Testing and simulation of the SOT induced magnetization dynamic may be used to verify the effects of pulse width and, in the case of a single pulse, select a specific pulse width or a range of pulse widths that avoid a specific pulse width determined to cause a switching-back response, depending on the device materials, layer thicknesses, geometry, of the SOT device. Such operation may be better understood by considering the following examples.

Figure 1A:
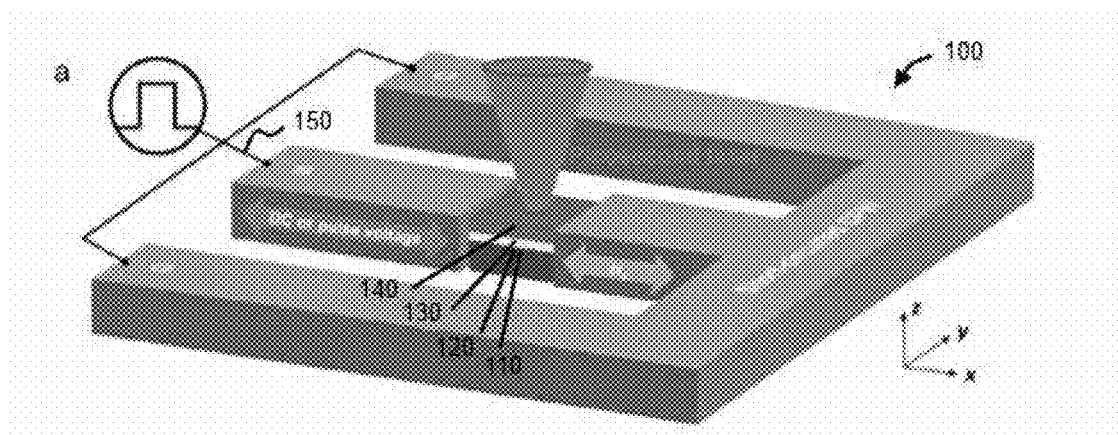
FIG. 1A is a schematic diagram of an example film structure and sample pattern for electric pulse measurements for an example SOT device having an HM/FM/metal oxide multilayer stack.

FIG. 1A is a schematic diagram 100 of an example film structure and sample pattern for electric pulse measurements for an example SOT device having an HM/FM/metal oxide multilayer stack. Specifically, in this example the layer stack includes a substrate, a HM layer of Tantalum (Ta) of 6 nm 110, a FM layer of Cobalt-Iron-Boron alloy (CoFeB) of 0.8 or 1.0 nm 120, a metal oxide layer 130 of Magnesium Oxide (MgO) of 2 nm, and a capping layer 140 of 3 nm. The layers possess perpendicular magnetic anisotropy (PMA), whose magnetization predominantly orients perpendicular to the layer plane (the x-y plane in FIG. 1A). The layers are subsequently patterned into a 3 μm by 3 μm square (i.e. a sample) and then a coplanar waveguide (i.e. an electrode) 150 is patterned. In-plane current pulses may be applied to the SOT device, passing through the HM layer in the x-direction. In time-resolved (TR) magneto optical Kerr effect (MOKE) measurements, the temporal magnetization trajectory may be observed by a stroboscopic pump-and-probe technique using a pulse generator (i.e. an electric pump) to generate the in-plane current pulses and picosecond laser (i.e. an optical probe) to measure response signals.

Figure 1B:
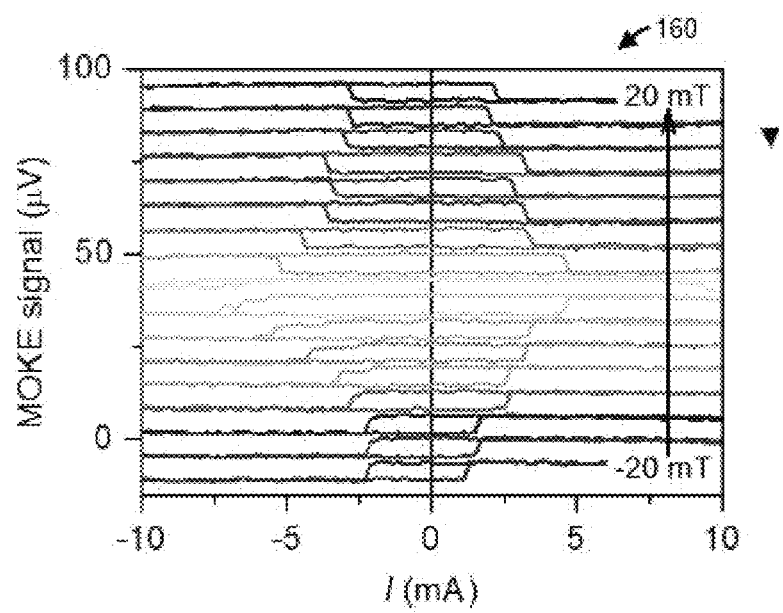
FIG. 1B is a graph showing static polar MOKE signals as a function of I, which indicates switching due to the SOT generated by an input current with various $H_x$.
Figure 1C:
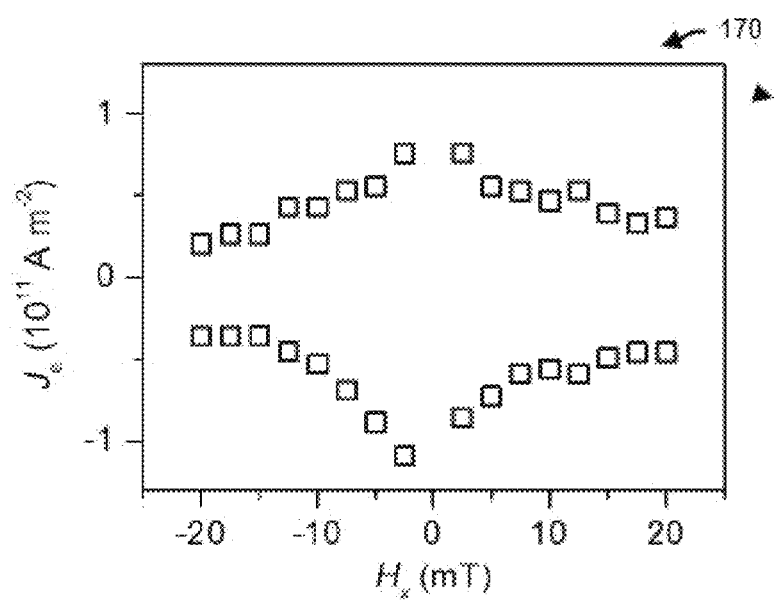
FIG. 1C is a switching-phase diagram of input current induced magnetization switching.

FIG. 1B is a graph 160 showing static polar MOKE signals as a function of input current (I), which indicates switching due to the SOT generated by an input current with various in-plane assist magnetic fields to the x-direction ($H_x$). The MOKE signal corresponds to the z-component of the magnetization averaged over the area in a laser spot ($M_z$), along the perpendicular magnetic anisotropy axis. FIG. 1C is a switching-phase diagram 170 of input current induced magnetization switching. It should be observed that the switching current density ($J_e$) decreases with increasing $H_x$.

Figure 2A:
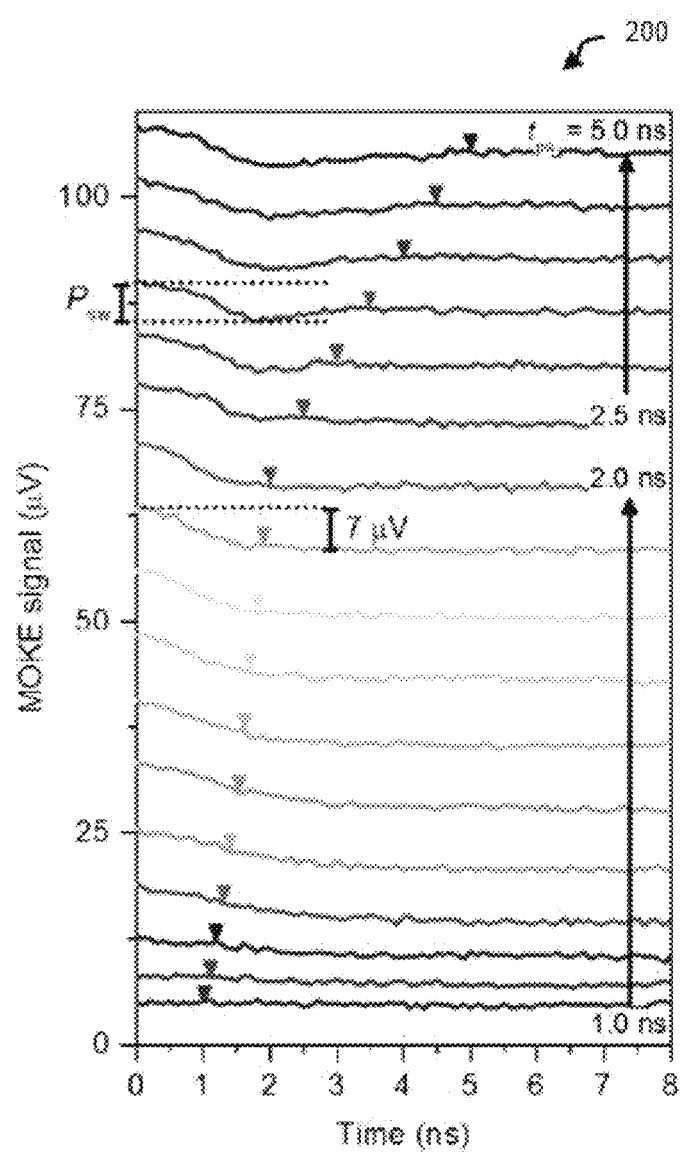
FIG. 2A is a graph of temporal magnetization trajectory driven by SOT with various pulse widths from 1 ns to 2 ns, and from 2.5 ns to 5 ns, with 0.1 ns steps, and 0.5 ns steps, respectively.

FIG. 2A is a graph 200 of temporal magnetization trajectory driven by SOT with various pulse widths from 1 ns to 2 ns, and from 2.5 ns to 5 ns, with 0.1 ns steps, and 0.5 ns steps, respectively. In this example, an $H_x$ of 168 mT is applied parallel to the pulse direction to layers of 6 nm of Ta, 0.8 nm of CoFeB, and 2 nm of MgO. The end of each pulse is indicated by a triangle in the graph 200. In dynamic MOKE signals, high and low intensities indicate that the magnetization is up and down, respectively. The maximum difference voltage between the highest and lowest intensities corresponds to a full magnetization switching, which is 7 μV in FIG. 2A. When input current of various pulse widths ($t_{pw}$) are applied with a $J_e$ of $5.2 \times 10^{11}$ A m$^{-2}$, the temporal trajectory of $M_z$ is shown in FIG. 2A.

Figure 2B:
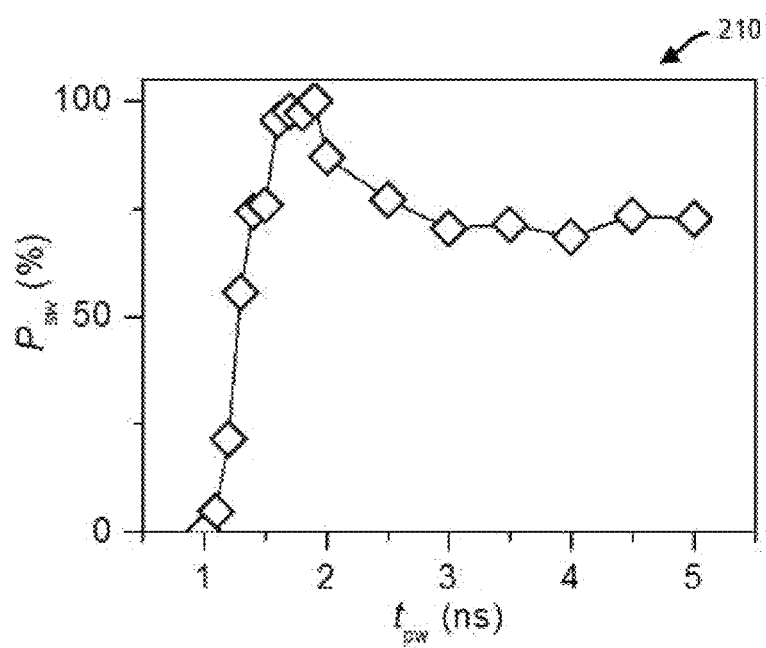
FIG. 2B is a graph of $P_{sw}$ vs. $t_{pw}$ of an input signal for the example of FIG. 2A.

A switching probability ($P_{sw}$) is represented as a ratio (%) of the magnetization switching corresponding to a difference between the highest and lowest intensities in each trajectory of $M_z$. FIG. 2B is a graph 210 of $P_{sw}$ vs. $t_{pw}$ of an input signal for the example of FIG. 2A. As can be observed, switching probability increases with increasing the pulse width from 1 ns to 1.9 ns. The SOT induced by pulses can drive a certain amount of the magnetization reversal, corresponding to the $t_{pw}$. If the $t_{pw}$ is not long enough, the magnetization is partially switched. When the $t_{pw}$ is too long (e.g., longer than 1.9 ns in this example), the switching probability decreases due to a switching-back response, where the magnetization directions at least partially switches back to its initial direction. At such moment, the effect of the SOT induced by the pulse cannot drive the FM switching anymore. When switching-back occurs, the SOT device may finally settle in an intermediate state without full deterministic switching. Therefore, in order to achieve a desirable (e.g., substantially 100% switching probability), a specific pulse width (e.g. 1.9 ns in this example) for the input current may be determined via physical testing of the device, the exact value depending on the device materials, layer thicknesses, geometry, etc.

Figure 2C:
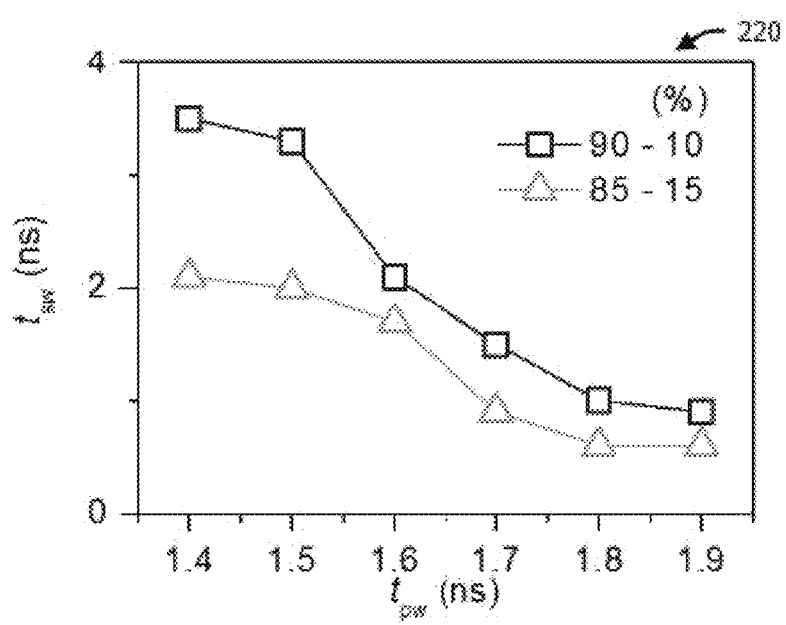
FIG. 2C is a graph of $t_{sw}$ vs. $t_{pw}$ of an input signal for the example of FIG. 2A.

FIG. 2C is a graph 220 of switching time ($t_{sw}$) vs. $t_{pw}$ of an input signal for the example of FIG. 2A. Switching time decreases with increasing pulse width as shown. The switching time is defined by 90%–10% or 85%–15% of fall time, from the highest to the lowest in the MOKE signal. Polarized spins are accumulated at the interface between FM and HM layers for the time corresponding to the pulse width. Depending on that time, the $M_z$ is switched by the SOT due to the angular momentum of polarized spins. For 1.4-ns and 1.5-ns pulse widths, a large gap of the $t_{sw}$ between 90%–10% and 85%–15% curves indicates that the $M_z$ is gradually switched to a certain state.

Figure 3A:
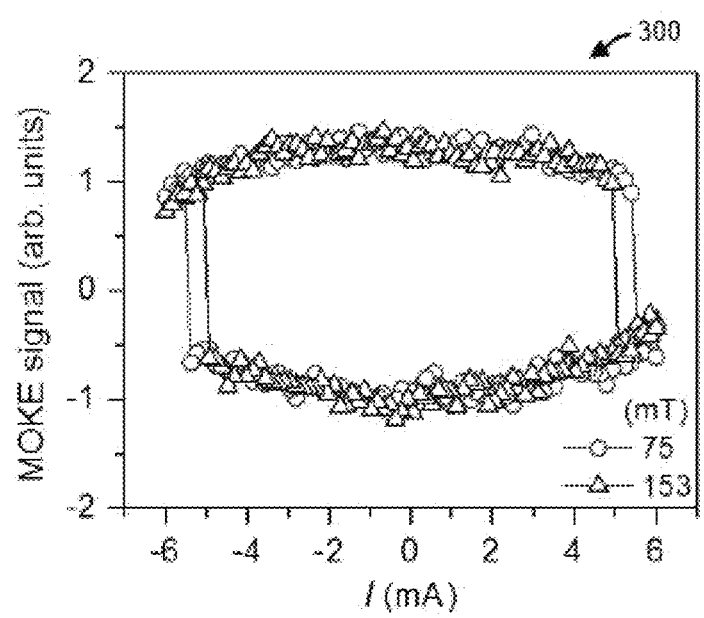
FIG. 3A is a graph of MOKE signals as a function of I with various $H_x$.
Figure 3B:
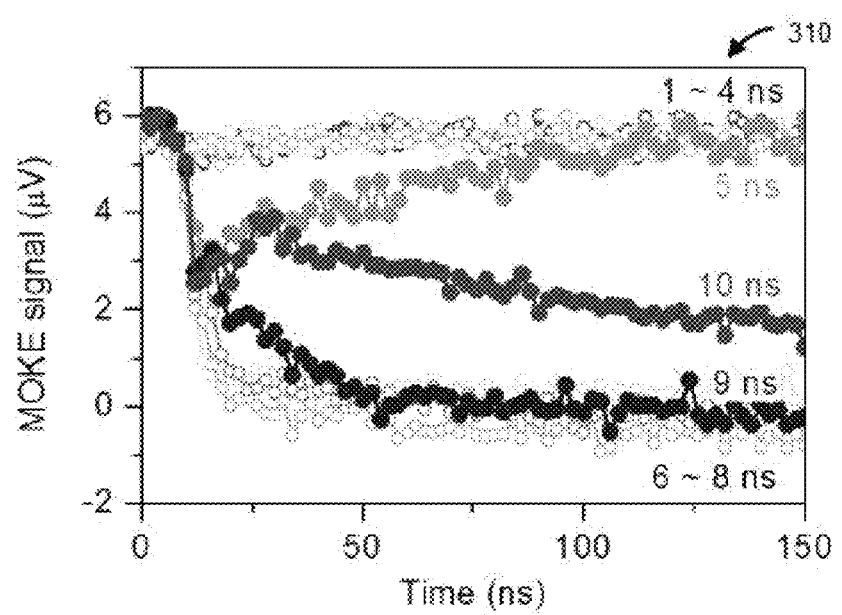
FIG. 3B is a graph showing temporal trajectories of $M_z$ trajectory as a function of various $t_{pw}$, at $H_x$ of 153 mT, for a scanning time of 150 ns, using the same example as FIG. 3A.

The potential of a switching-back response that should be avoided may be further illustrated by another example of induced magnetization switching. FIG. 3A is a graph 300 of MOKE signals as a function of I with various $H_x$. In this example, an $H_x$ of 73 mT and 153 mT is applied to layers of 6 nm of Ta, 1.0 nm of CoFeB, and 2 nm of MgO to observe SOT induced magnetization dynamics. FIG. 3B is a graph 310 showing temporal trajectories of $M_z$ trajectory as a function of various $t_{pw}$ at $H_x$ of 153 mT for a scanning time of 150 ns using the same example as FIG. 3A. As can be seen, for $t_{pw}$ 1 ns to 4 ns, the $M_z$ is not switched due to a lack of the SOT effect. When the $t_{pw}$ is 5 ns, a half-switching is achieved and then the device returns back to the initial state to obtain a minimum magnetostatic energy. This indicates that a 5-ns pulse can lead to a nucleate of domain walls (DWs), however, it is not enough to propagate the DW for the full switching of the magnetization direction. If the $t_{pw}$ is longer than 5 ns and less than 9 ns, the $M_z$ is fully switched. Particularly, when the $t_{pw}$ is 10 ns, the $M_z$ trajectories are curved by the switching-back response and a full switching is not achieved. Therefore, in order to achieve desirable (e.g., substantially 100%) switching probability, a range of pulse widths (e.g., 6-9 ns in this example) may be applied. The specific range may be determined via physical testing of the device and depend on the device materials, layer thicknesses, geometry, etc.

Figure 3C:
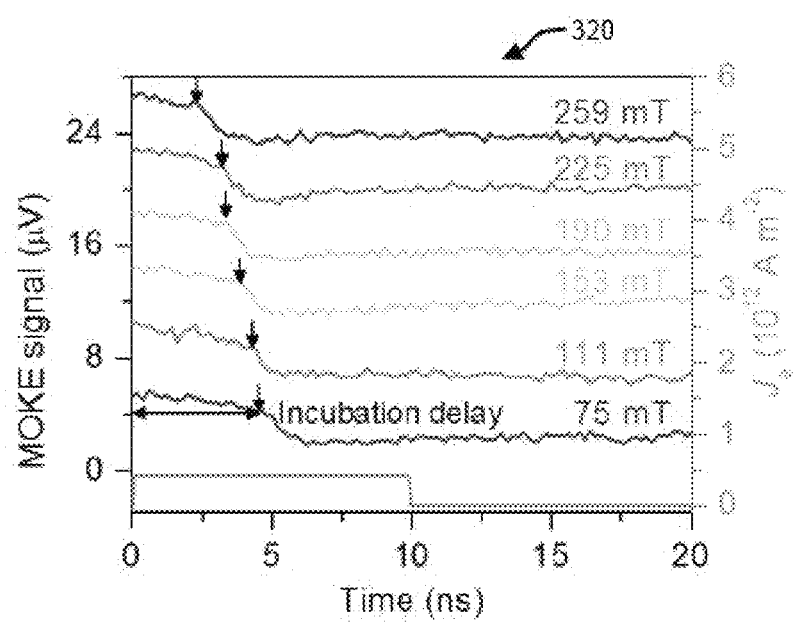
FIG. 3C is a graph showing temporal trajectories of $M_z$ with various $H_x$ for same example as FIG. 3A, with a 10 ns pulse width and an intensity of $4.2 \times 10^{11}$ A m$^{-2}$, and with incubation delay being indicated via an arrow.
Figure 3D:
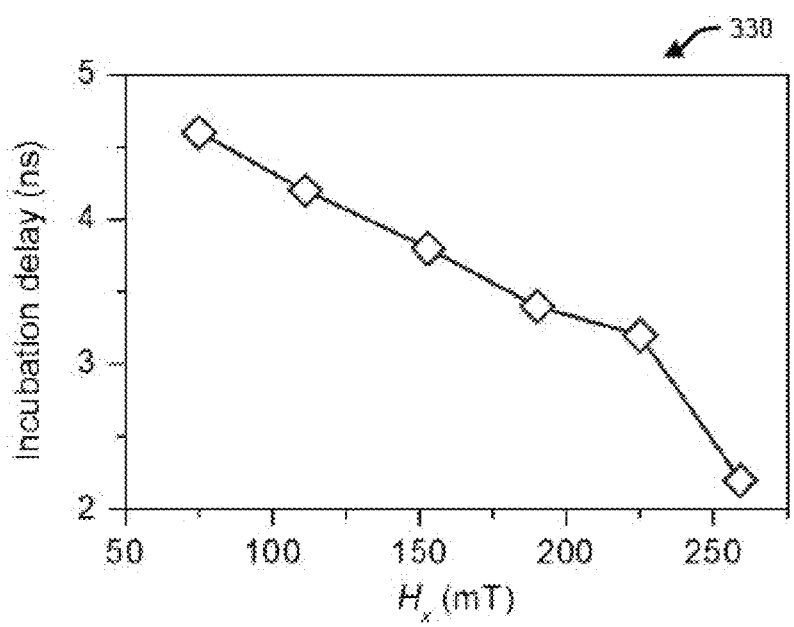
FIG. 3D is a graph of incubation delay vs. $H_x$ for the same example as FIG. 3A, again with a 10 ns pulse width and an intensity of $4.2 \times 10^{11}$ A m$^{-2}$.

Switching speed may be increased in the SOT device by decreasing incubation delay. The incubation delay refers to the time delay from the starting of the pulse excitation to the time when the magnetization switching starts to take place. For SOT induced magnetization switching, the incubation delay is measured by the $M_z$ trajectory in various $H_x$. FIG. 3C is a graph 320 showing temporal trajectories of $M_z$ with various $H_x$, for same example as FIG. 3A, with a 10 ns pulse width and an intensity of $4.2 \times 10^{11}$ A m$^{-2}$, with incubation delay being indicated via an arrow. FIG. 3D is a graph 330 of incubation delay vs. $H_x$ for the same example as FIG. 3A, again with a 10 ns pulse width and an intensity of $4.2 \times 10^{11}$ A m$^{-2}$. As can be seen, incubation delay decreases with increasing $H_x$ in the SOT switching, in a similar way that a higher $H_x$ gives rise to a reduction in the switching current density ($J_e$). As a result, it is observed that the incubation delay can be reduced by applying a higher $H_x$ in the SOT induced magnetization switching.

Likewise, a specific pulse width or a range of pulse widths that avoid a pulse width that causes a switching-back response may be determined via simulation. In one case the simulation may take the form of micromagnetic simulations using an objected oriented micromagnetic framework (OOMMF).

Figure 4A:
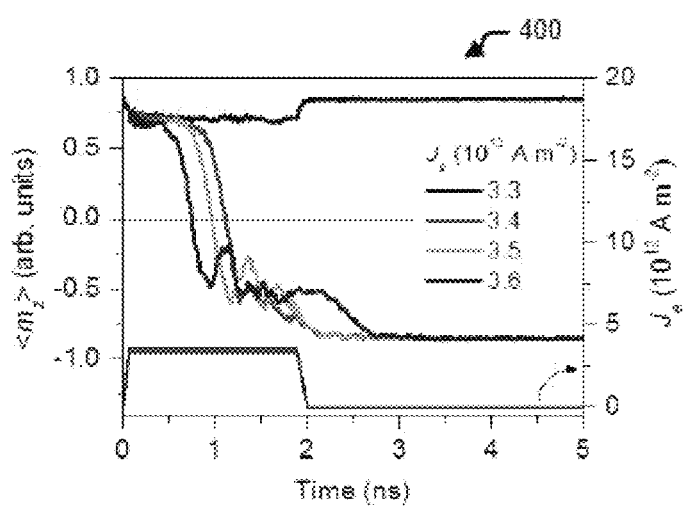
FIG. 4A is a graph of simulated temporal trajectories of $m_z$ for various $t_{pw}$ in an example configuration.
Figure 4B:
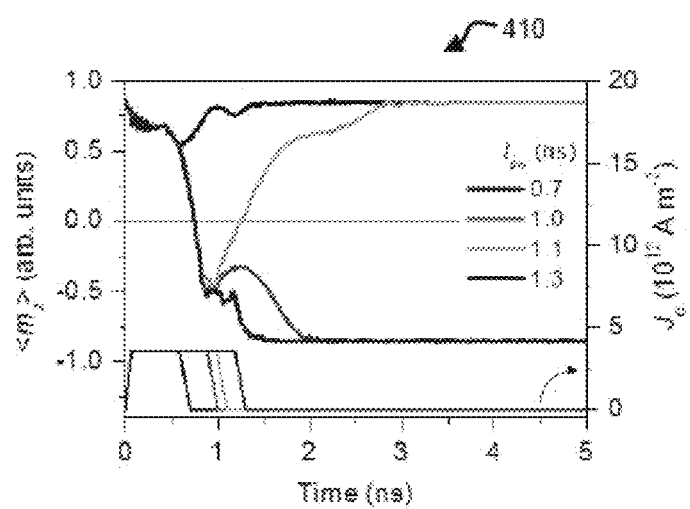
FIG. 4B is a graph of simulated temporal trajectories of $m_z$ for various $H_x$ for the same example as FIG. 4A.
Figure 4C:
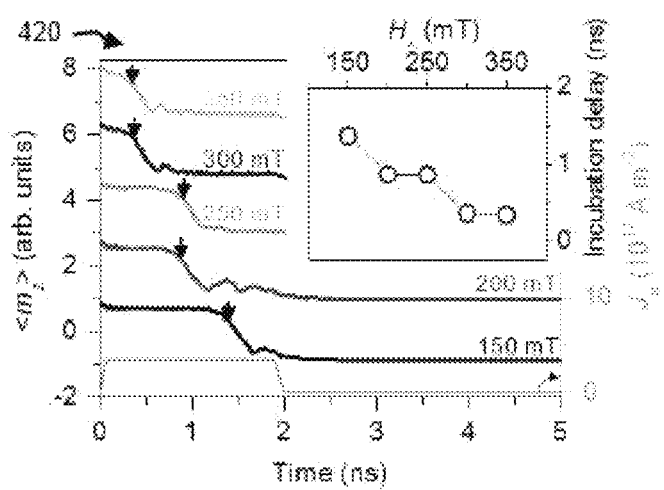
FIG. 4C is a graph of simulated temporal trajectories of $m_z$ for various $H_x$ in another example configuration, with incubation delay as a function of $H_x$ in the inset.

FIG. 4A is a graph 400 of simulated temporal trajectories of $m_z$ for various $J_e$ in an example configuration. FIG. 4B is a graph 410 of simulated temporal trajectories of $m_z$ for various $t_{pw}$ for the same example as FIG. 4A. The example configuration of FIGS. 4A and 4B involves a pulse width of 2 nm and a pulse intensity of $3.6 \times 10^{12}$ A m$^{-2}$. FIG. 4C is a graph 420 of simulated temporal trajectories of $m_z$ for various $H_x$ in another example configuration, with incubation delay as a function of $H_x$ in the inset. The example configuration of FIG. 4C involves a pulse width of 2 nm and a pulse intensity of $3.5 \times 10^{12}$ A m$^{-2}$. The magnetization up or down corresponds to $<m_z>=1$ or $-1$, respectively. A switching-back response is observed by the pulse width variation in FIG. 4B. As can be seen in this example, the $<m_z>$ is not switched with a 0.7-ns pulse. Full switching occurs at 1.0-ns and 1.3-ns pulse. However, at a pulse width of 1.1 nm, the $<m_z>$ trajectory is switched and then may be switched back to the initial state by switching-back.

Figure 4D:
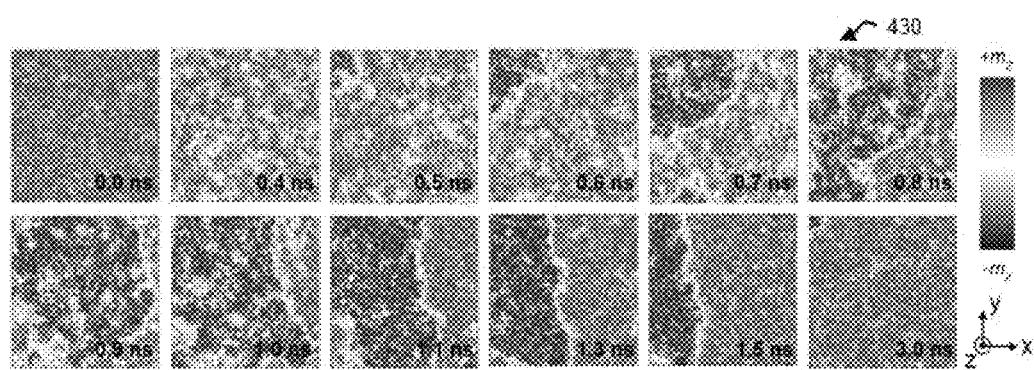
FIG. 4D is a series of transient snapshots of magnetization configurations for a 1.1-ns pulse and a pulse intensity of $3.6 \times 10^{12}$ A m$^{-2}$.

FIG. 4D is a series of transient snapshots of magnetization configurations for a 1.1-ns pulse and a pulse intensity of $3.6 \times 10^{12}$ A m$^{-2}$. The differing shading represents magnetization up (+$m_z$) and down (−$m_z$) in each cell, respectively. At 0.5 ns, the local area of the magnetization at the top left corner is switched down. By 0.9 ns, the domain wall propagates to the lower-right edge. If the pulse ends at 1 ns, the magnetization is fully switched and a switching-back does not happen as shown in FIG. 4B. However, if the pulse width is 1.1 ns, the domain wall propagates back to the opposite direction. After the end of 1.1-ns pulse, the domain wall continuously propagates to the opposite edge, and the switching-back process occurs. As this example illustrates, a specific pulse width that causes a switching-back response may be determined by simulation and avoided when selecting a pulse width or a range of pulse widths to utilize with input current applied to a SOT device.

Further, simulation may show that switching speed may be increased in a SOT device by decreasing incubation delay by increasing $J_e$. As seen in FIG. 4A, the temporal $<m_z>$ trajectory is affected by the various magnitudes of $J_e$. When the $J_e$ is $3.3 \times 10^{12}$ A m$^{-2}$, the $<m_z>$ shows a non-switching trajectory, because the SOT effect is insufficient to nucleate the DW to initiate the switching. When the $J_e$ is higher than $3.3 \times 10^{12}$ A m$^{-2}$, the SOT can lead to a reversal of the domain and to propagate the DWs. Consequentially, the incubation delay can be reduced by increasing $J_e$.

Further, 4C is a graph of the <$m_z$> trajectory with various $H_x$ for the same example as FIGS. 4A and 4B. Consistent with the results discussed above, incubation delay decreases with increasing $H_x$.

The above discussed tuning of pulse width to achieve desirable (e.g., substantially 100%) SOT switching probability is also applicable to sub-nano second widths used with high speed switching in smaller devices (e.g., diameter <100 nm), where the switching probability is expected to be oscillatory due to more coherent precession. For example, the technique may be applicable to SOT-magnetic random access memory (MRAM) devices which operate at a short pulse width regime (from sub-nano second to several nanoseconds).

Figure 5A:
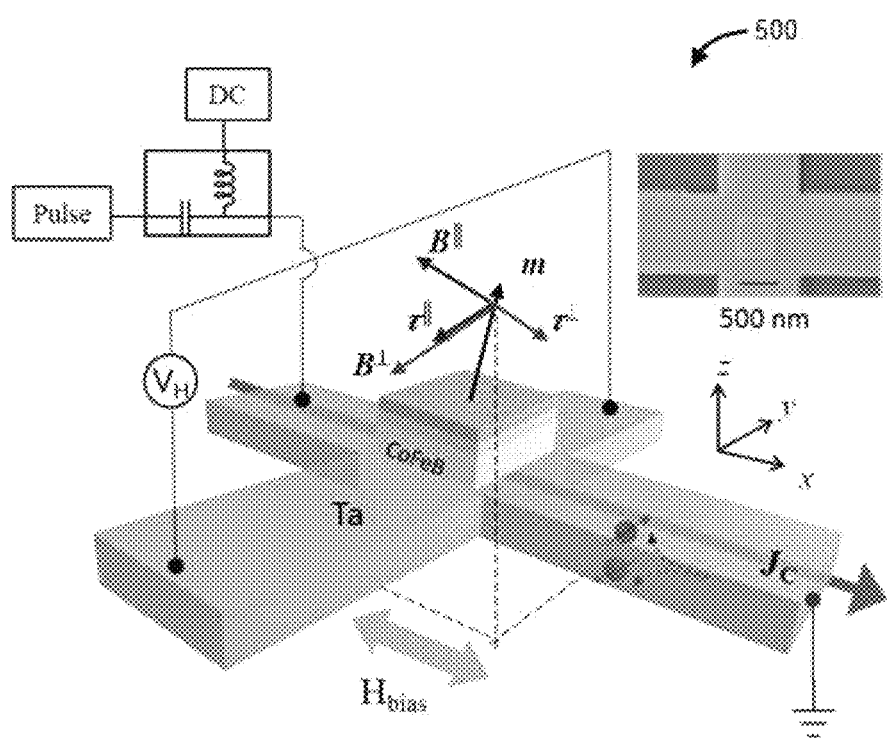
FIG. 5A is a schematic illustration of an example device and an electrical measurement set-up, with a scanning electron microscope image in the inset.

FIG. 5A is a schematic illustration 500 of an example device and an electrical measurement set-up, with a scanning electron microscope image in the inset. In this example, a first sample (sample A) and a second sample (sample B) have a layer stack that includes a HM layer of Ta of 6 nm, a FM layer of $Co_{40}Fe_{40}B_{20}$ of 1.0 nm, a metal oxide layer of MgO of 2.0 nm, and a capping layer of $SiO_2$ of 3.0 nm on top of a $Si/SiO_2$ substrate, and is circular with diameter of 500 nm, and circular with a diameter of 300 nm, respectively. A third sample (sample C) and a fourth sample (sample D) have a layer stack that includes a HM layer of Ta of 6 nm, a FM layer of $Co_{40}Fe_{40}B_{20}$ of 0.8 nm, a metal oxide layer of MgO of 2.0 nm, and a capping layer of $SiO_2$ of 3.0 nm on top of a $Si/SiO_2$ substrate, and is square with measurements of 1 μm×1 μm, and square with measurements of 0.5 μm×0.5 μm, respectively. An input current is injected through the Ta underlayer and the Hall voltage is measured to sense the perpendicular magnetization state, either M↑ or M↓. For the pulse measurement, a pulse current of nanosecond widths from the pulse generator is transferred by using a ground-signal-ground probe. For the confirmation of the perpendicular anisotropy, an assist magnetic field to the z-direction, $H_z$ is applied along with the easy axis, measuring the Hall resistance ($R_{Hall}$).

Figure 5B:
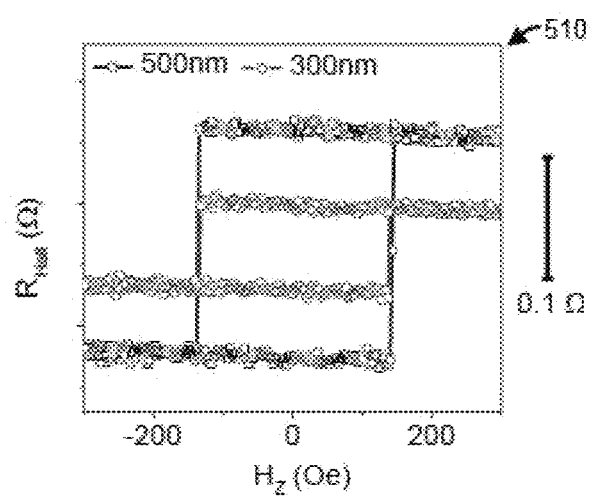
FIG. 5B is a graph of $R_{Hall}$ vs. $H_z$ for a sample A (500 nm) and sample B (300 nm) discussed herein.

FIG. 5B is a graph 510 of $R_{Hall}$ vs. assist magnetic field to the z-direction ($H_z$) for the sample A (500 nm) and sample B (300 nm) discussed above. In this example, the switching field from the sample A and B is found to be ~140 Oe, showing good perpendicular anisotropy. In order to estimate the anisotropy fields ($H_k$), $H_x$ is applied along with the in-plane hard axis, and the $R_{Hall}$ is measured.

Figure 5C:
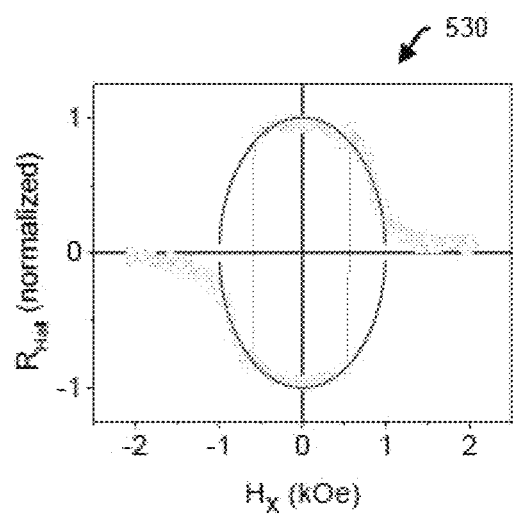
FIG. 5C is a graph of $R_{Hall}$ vs. $H_x$ for the sample A discussed herein.

FIG. 5C is a graph 520 of $R_{Hall}$ vs. $H_x$ for the sample A discussed above. By using $M_z/M_s$=cos(arcsin($H_x/H_k$)), where $M_z$ is the z-component of the magnetization and $M_s$ is the saturation magnetization, $H_k$ is estimated to be smaller than 1 kOe for both sample A and sample B, and to be smaller than 5 kOe for both sample C and sample D.

Figure 6A:
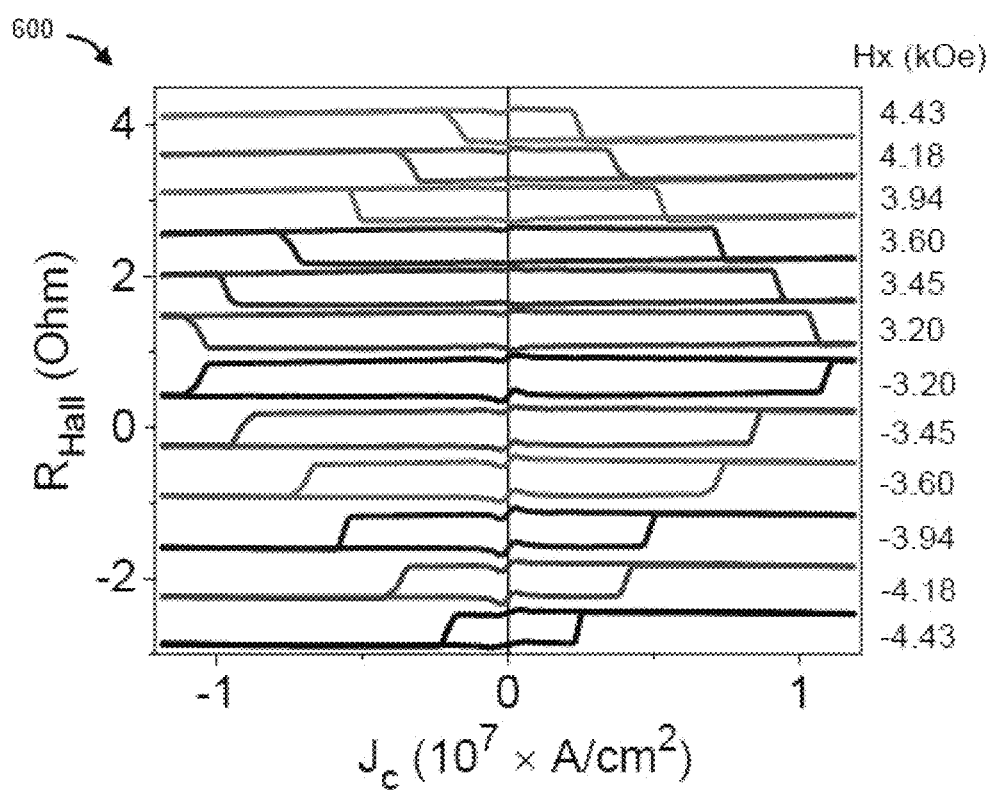
FIG. 6A is a graph of the induced magnetization reversal with various $H_x$ from sample D discussed above.
Figure 6B:
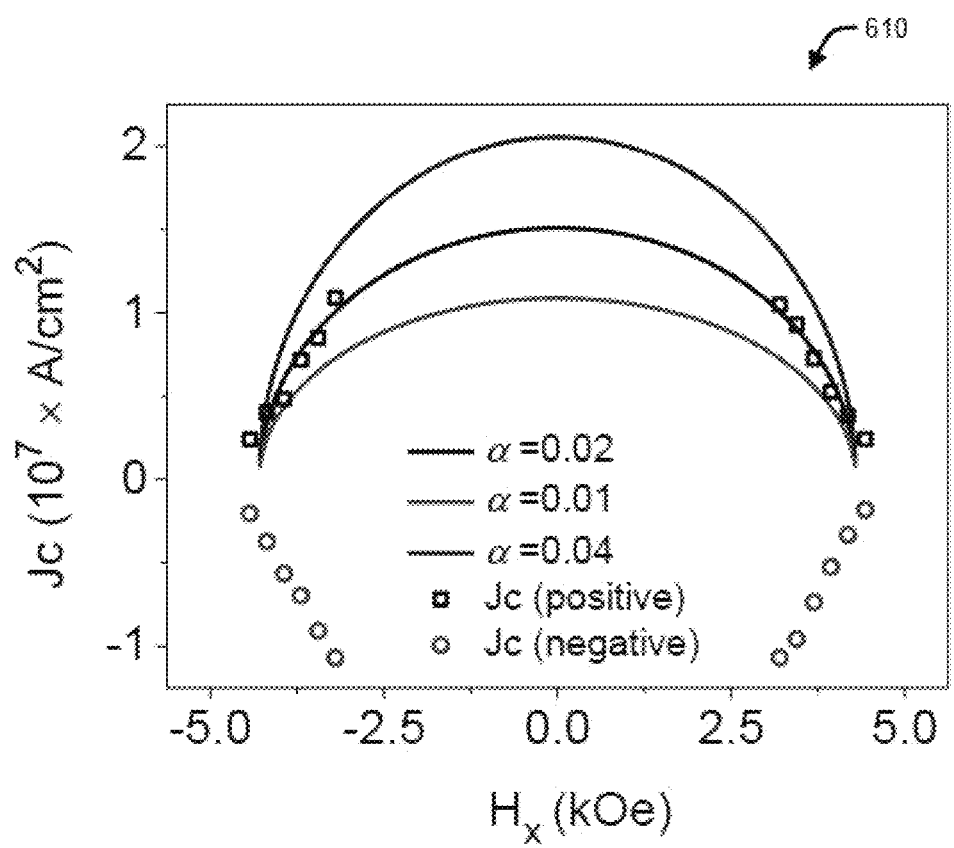
FIG. 6B is a graph of $J_c$ estimated from FIG. 6A.

FIG. 6A is a graph 600 of the induced magnetization reversal with various $H_x$ from sample D discussed above. FIG. 6B is a graph 610 of critical current ($J_c$) estimated from FIG. 6A. One can write the equation for $H_x$ vs. $J_c$ as:

$$J_c = \frac{2e\sqrt{\alpha M_s d}}{\hbar \theta_{SH}} \frac{\sqrt{H_k^2 - H_x^2}}{\sqrt{\eta(2+\alpha\eta)}},$$

where e is the electron charge, α is the damping constant, $M_s$ is the saturation magnetization, d is the FM thickness, h is Planck's constant, $\theta_{SH}$ is the spin Hall angle, and η is the ratio of field-like torque to damping-like torque. The $M_s$ and $H_k$ are constant as 1.2 T and 4.3 kOe, respectively.

Figure 7A:
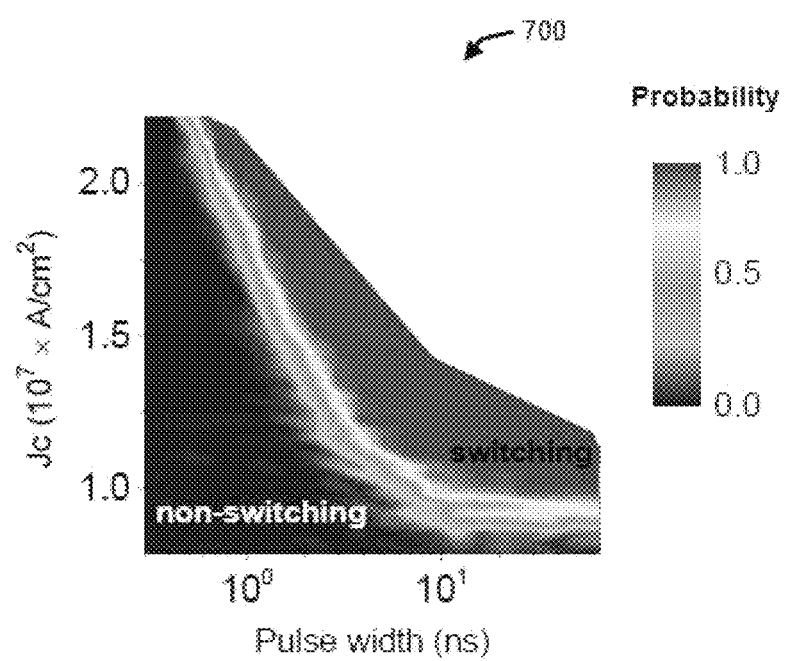
FIG. 7A is a SPD as a function of $t_{pw}$ and $J_c$ at a specific $H_x$ for the sample C discussed herein.

A first example involves deterministic switching behavior without switching-back. FIG. 7A is a switching phase diagram (SPD) 700 as a function of $t_{pw}$ and $J_c$ at a specific $H_x$ (in this example, $H_x$=3.94 kOe) for the sample C discussed above. The $R_{Hall}$ is measured after the single pulse to sense the magnetization state. The pulse width ranges from 300 ps to 66 ns. The reset voltage is applied to initiate the direction of magnetization for every switching event. Each switching event shows either high or low $R_{Hall}$, indicating that the magnetization is either up or down, and it does not have intermediate resistance between high and low $R_{Hall}$. In this example, 30 times of the switching event were performed to estimate the switching probability. The SPD shows the boundary of 50% probability regime which indicates the critical $J_c$ between a switching and non-switching regime.

Figure 7B:
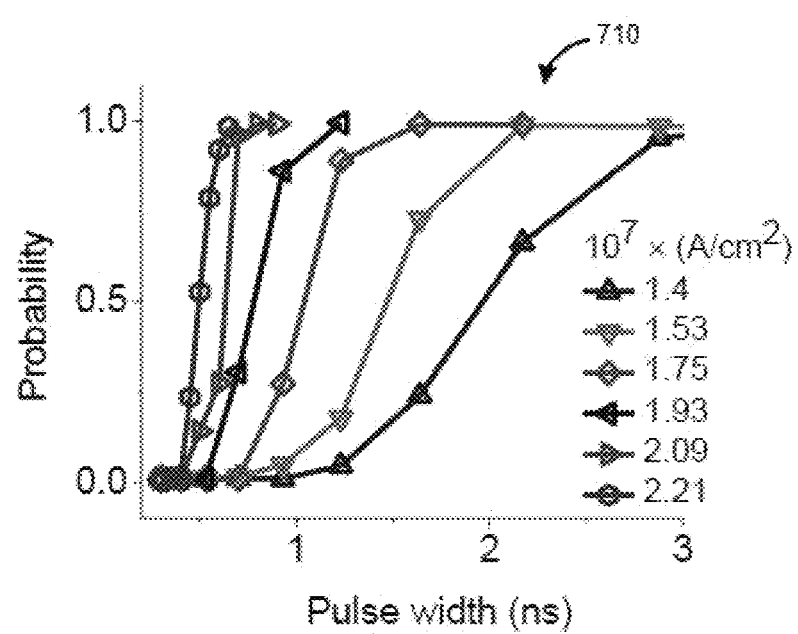
FIG. 7B is a graph illustrating the horizontal profile of the switching probability at a specific $J_c$ from FIG. 7A.
Figure 7C:
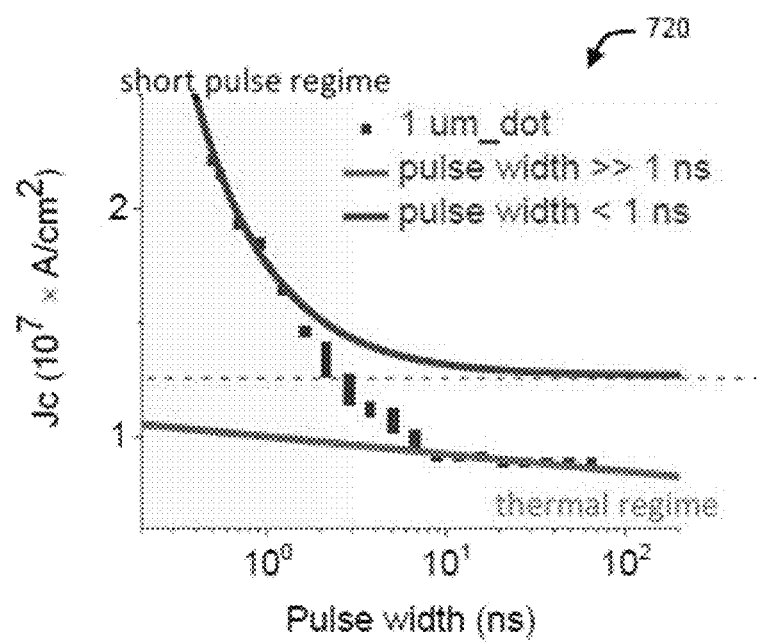
FIG. 7C is a graph showing a critical $J_c$ vs. $t_{pw}$.
Figure 7D:
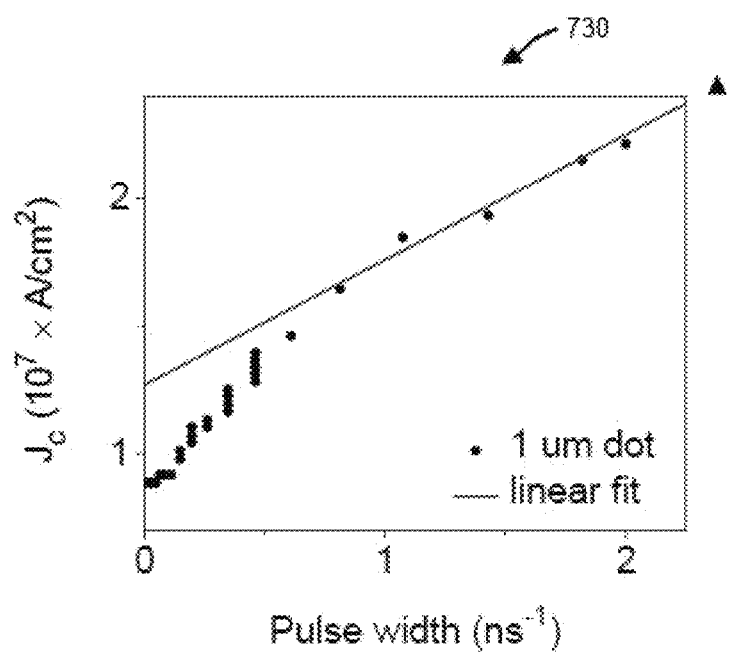
FIG. 7D is a graph of $J_c$ vs. $1/t_{pw}$.

FIG. 7B is a graph 710 illustrating the horizontal profile of the switching probability at a specific $J_c$ from FIG. 7A. For example, $t_{pw}$=500 ps shows 60% of switching probability at 2.21×10$^7$ A/cm$^2$. FIG. 7C is a graph 720 showing a critical $J_c$ (50% of probability) vs. $t_{pw}$. As can be seen, the $J_c$ sharply increases at the short pulse regime ($t_{pw}$<1 ns), while $J_c$ is relatively constant at the thermally activated regime ($t_{pw}$>10 ns). At short pulse widths, $J_c$ vs. $t_{pw}$ fits to the equation:

$$I_c = I_{c0} + q/t_{pw},$$

where $I_{c0}$ is the intrinsic critical switching current indicated by the dotted line and q is the number of electrons that need to be pumped into the system before switching occurs. FIG. 7D is a graph 730 of $J_c$ vs. $1/t_{pw}$. As can be seen, $J_c$ has a linear dependence on $1/t_{pw}$ at a short pulse width.

Figure 8A:
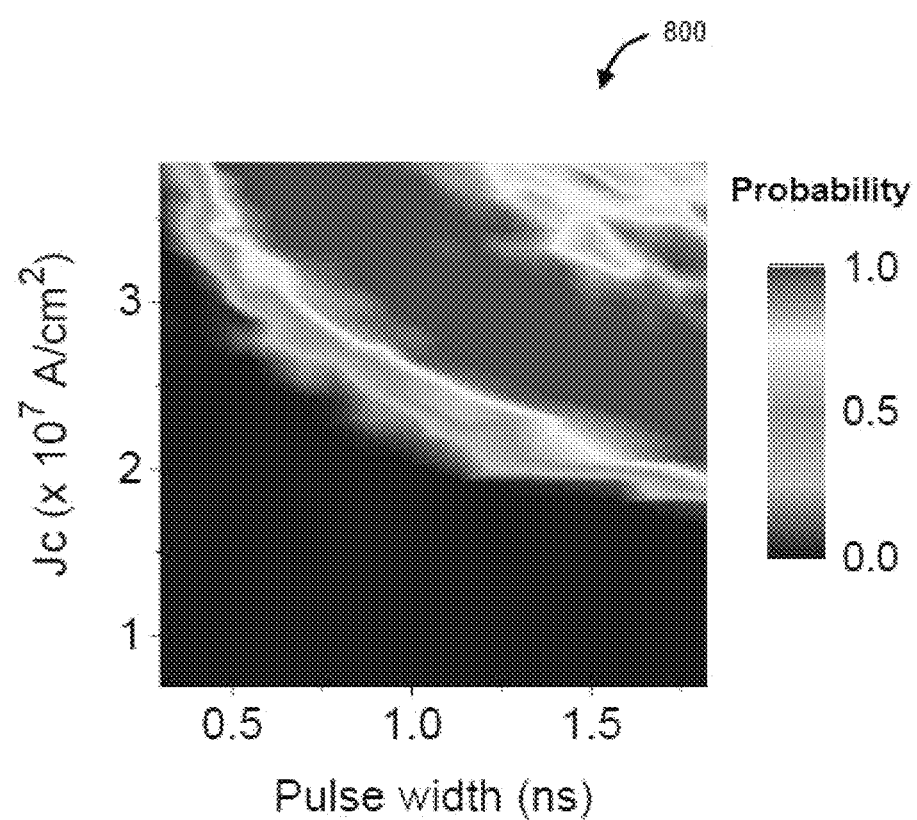
FIG. 8A is a SPD at a short $t_{pw}$ and a high $J_c$ for sample A discussed herein.
Figure 8B:
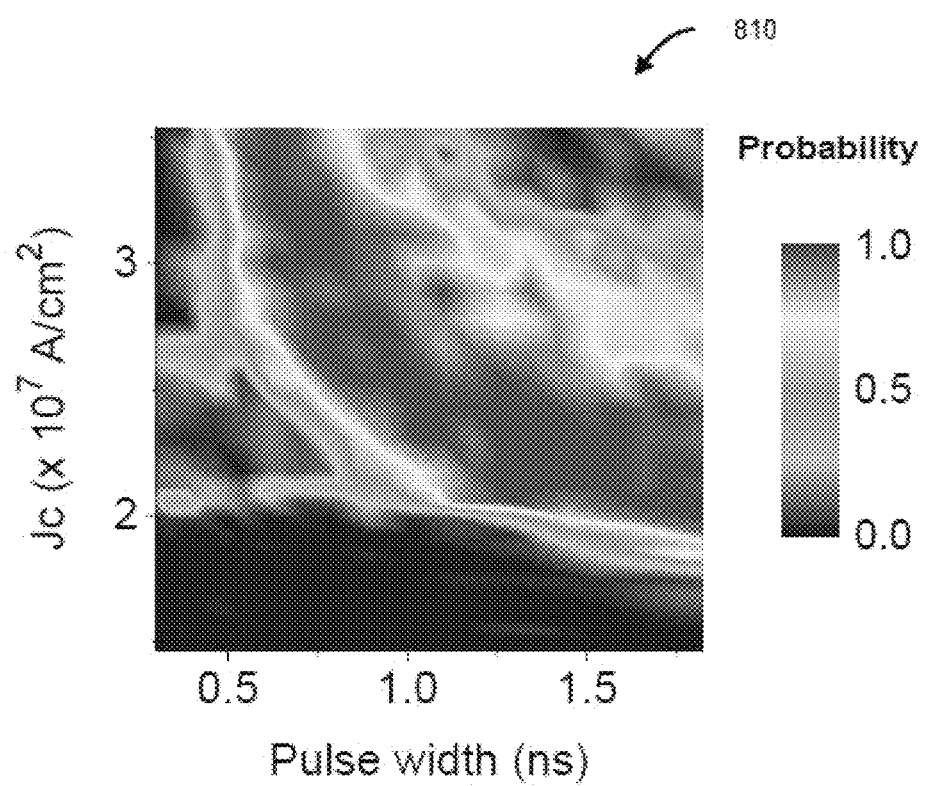
FIG. 8B is a SPD at a short $t_{pw}$ and a high $J_c$ for sample B discussed herein.
Figure 8C:
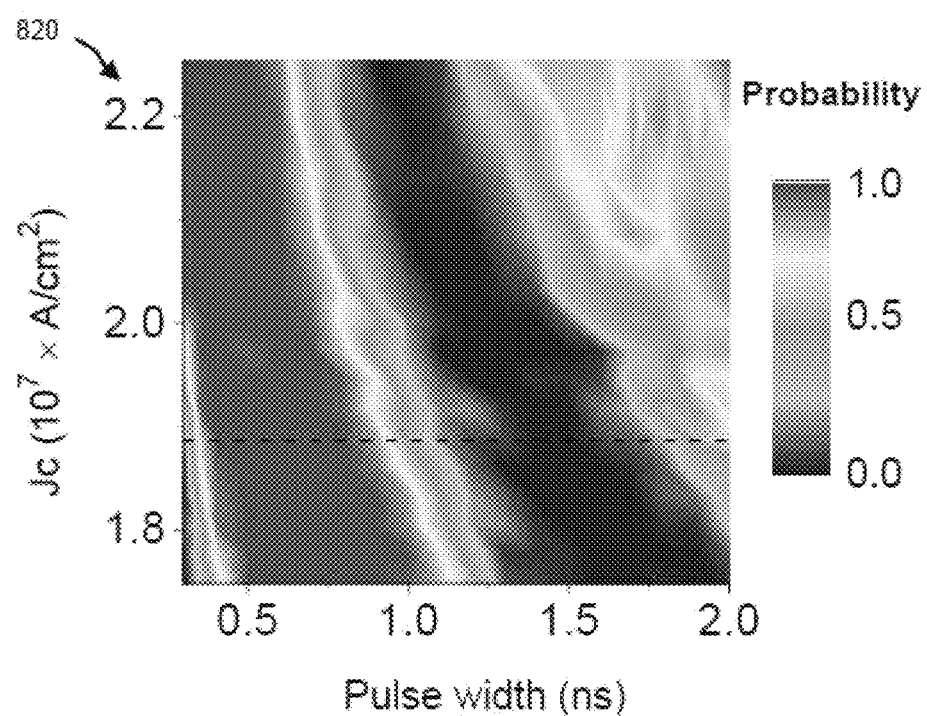
FIG. 8C is a SPD at a short $t_{pw}$ and a high $J_c$ for sample D discussed herein.
Figure 8D:
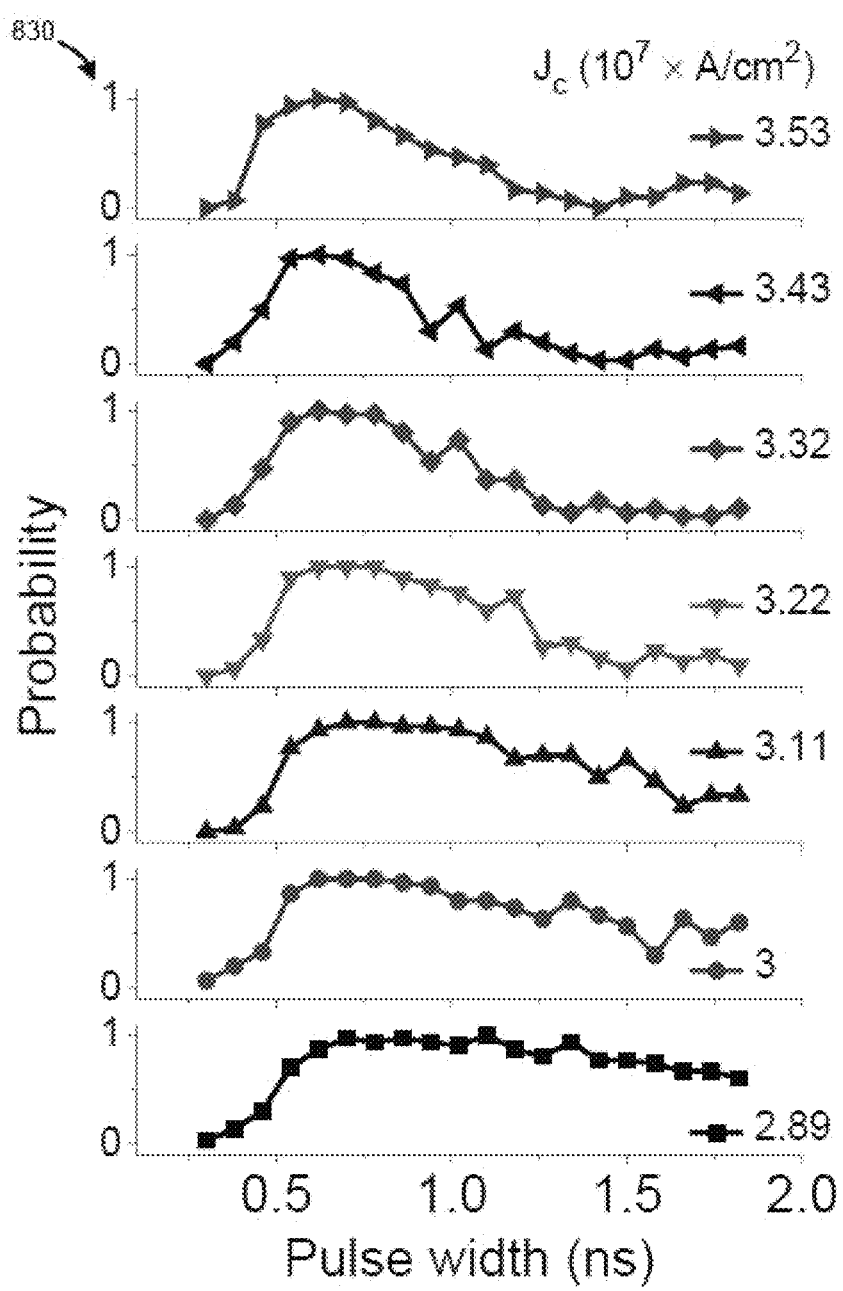
FIG. 8D is a graph of switching probability as a function of pulse width for sample B discussed herein at various $J_c$.

A second example involves an oscillatory SPD. FIG. 8A is a SPD 800 at a short $t_{pw}$ and a high $J_c$ for sample A discussed above. FIG. 8B is a SPD 810 at a short $t_{pw}$ and a $J_c$ for sample B discussed above. Likewise, FIG. 8C is a SPD 820 at a short $t_{pw}$ and a $J_c$ for sample D discussed above. The current density is restricted and the pulse width ranges 300 ps to 2 ns. The pulse width less than 2 ns is short enough for the devices not to be affected by Joule heating. Unlike for the sample C in FIG. 7A, the non-switching regimes take place after the switching regime at $J_c$ in the sample A, B and D. Moreover, in the SPD of FIG. 8C, it is observed that 0% of probability is followed by 100 of % of probability, and then 50~60% of probability occurs afterward. The non-switching regime may also appear for $t_{pw}$ shorter than 300 ps, as an extension of the zero switching area when $t_{pw}$ is slightly larger than 300 ps. FIG. 8D is a graph 830 of switching probability as a function of pulse width for sample B discussed above at various. As can be seen, the horizontal profiles show that the probability decreases with increasing $J_c$ at $t_{pw}$=1.5 ns.

Figure 8E:
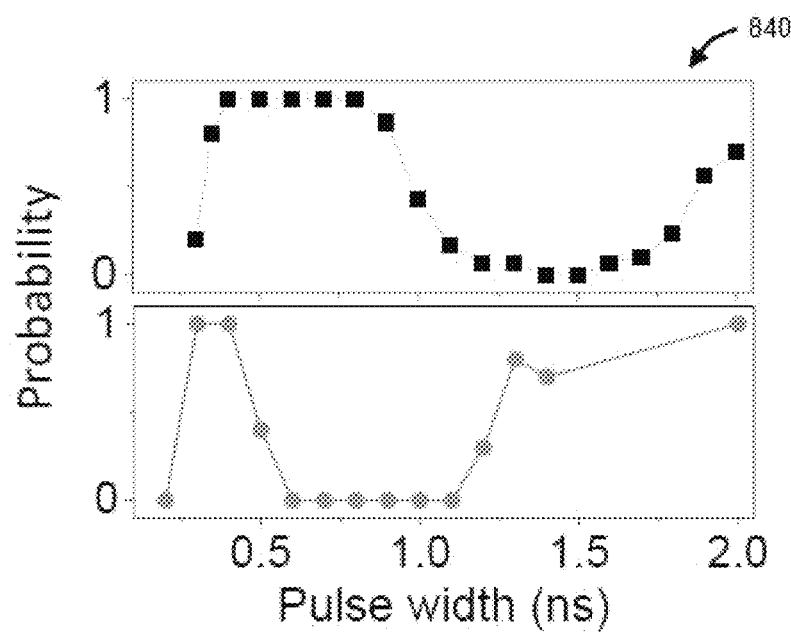
FIG. 8E is a graph of switching probability versus pulse width for simulation results (bottom panel) and physical testing (top panel) for sample D discussed herein.

For micromagnetic simulations, 10 times of independent trials of switching event were performed to estimate the switching probability. FIG. 8E is a graph 840 of switching probability versus pulse width for simulation results (bottom panel) and physical testing (top panel) for sample D discussed above. As can be seen, the simulation result in FIG. 8E (bottom panel) is in good agreement with the physical testing (top panel) from the sample D which corresponds to the dotted line in FIG. 8C.

In addition to a single pulse, multiple (e.g., 2) pulses may be applied to a SOT device to achieve desirable (e.g., substantially 100%) SOT switching probability. In such a case, subsequent pulses (e.g., the second pulse of 2 pulses) may prevent switching-back. Switching probability is affected the separation distance of pulses due to the interference effects from the pulses. Constructive and destructive interferences are caused in the magnetization dynamics resulting from two closely spaced voltage impulses for the modulation of the magnitude of the resultant switching process. When the phases of the magnetization dynamics in the neighboring pulse match, the switching process constructively interferes, whereas they destructively interfere when they are out-of-phase. Thus, a switching probability diagram is modified by using an input current composed of multiple pulses.

In the case of two pulse modulation, the interval between the two adjacent pulses, as well as each pulse's intensity, can be effectively used for controlling switching probability, in addition to each pulse's width. In some cases, the intensity of subsequent pulses may be less or more than the intensity of the initial pulse.

Figure 9A:
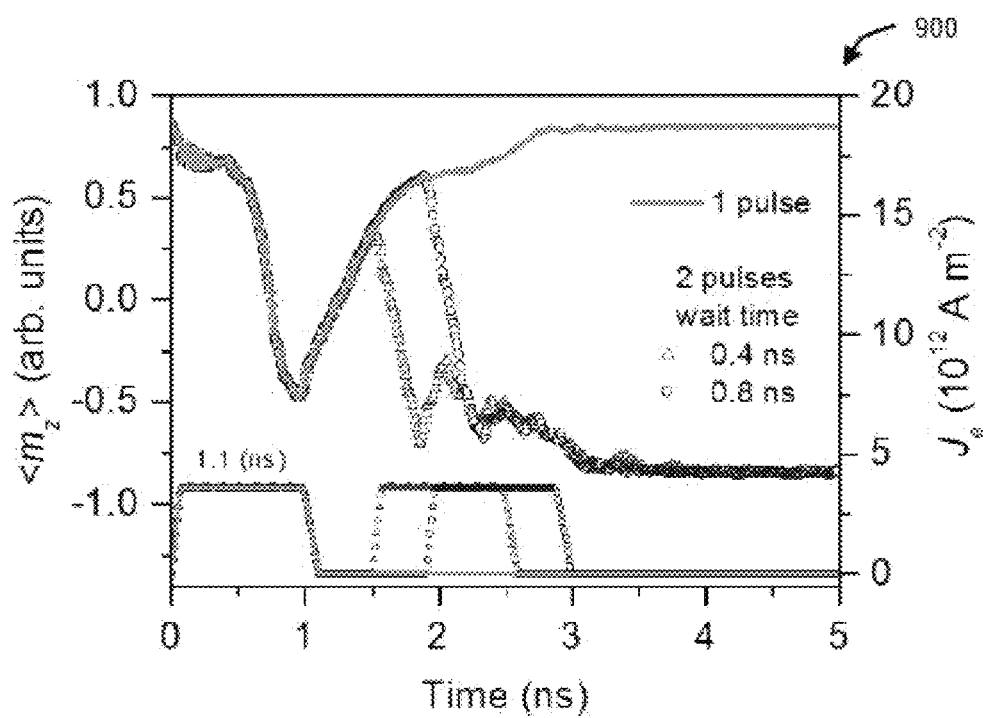
FIG. 9A is a graph of temporal trajectories of the $m_z$ for an example where two 1.1-ns pulses of equal intensity are applied with a wait time of 0.4 ns and 0.8 ns.
Figure 9B:
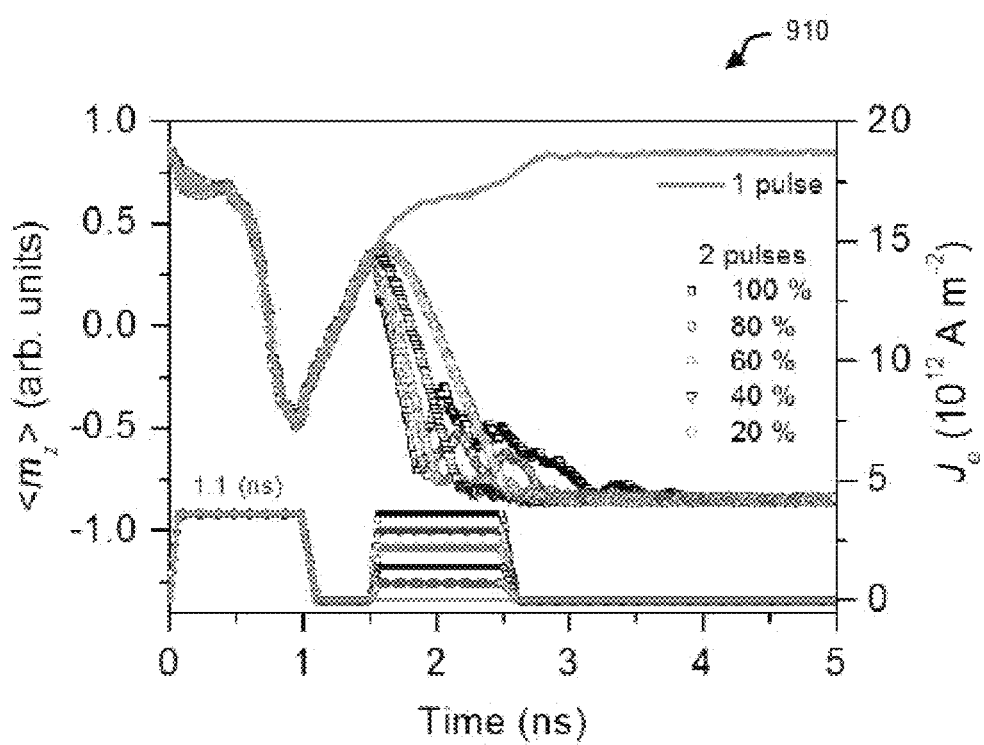
FIG. 9B is a graph of temporal trajectories similar to FIG. 9A, but with the second pulse having various reduced intensities.

FIG. 9A is a graph 900 of temporal trajectories of the $m_z$ for an example where two 1.1-ns pulses of equal intensity are applied. In this example, $J_e=3.6\times10^{12}$ A m$^{-2}$ is applied at $H_x=200$ mT, with 0.4-ns wait time and 0.8-ns wait time. As can be seen, the switching-back process is prevented by the second 1.1-ns pulse. FIG. 9B is a graph 910 of temporal trajectories similar to FIG. 9A, but with the second pulse having various reduced intensities. As can be seen, a second pulse with an intensity of only 20% of the first pulse can prevent the switching-back process. It should be understood that electrical modulation of switching dynamics using successive multiple pulses (e.g., two pulses or more than two pulses) is applicable to a wide range of the device structures and dimensions.

Figure 10A:
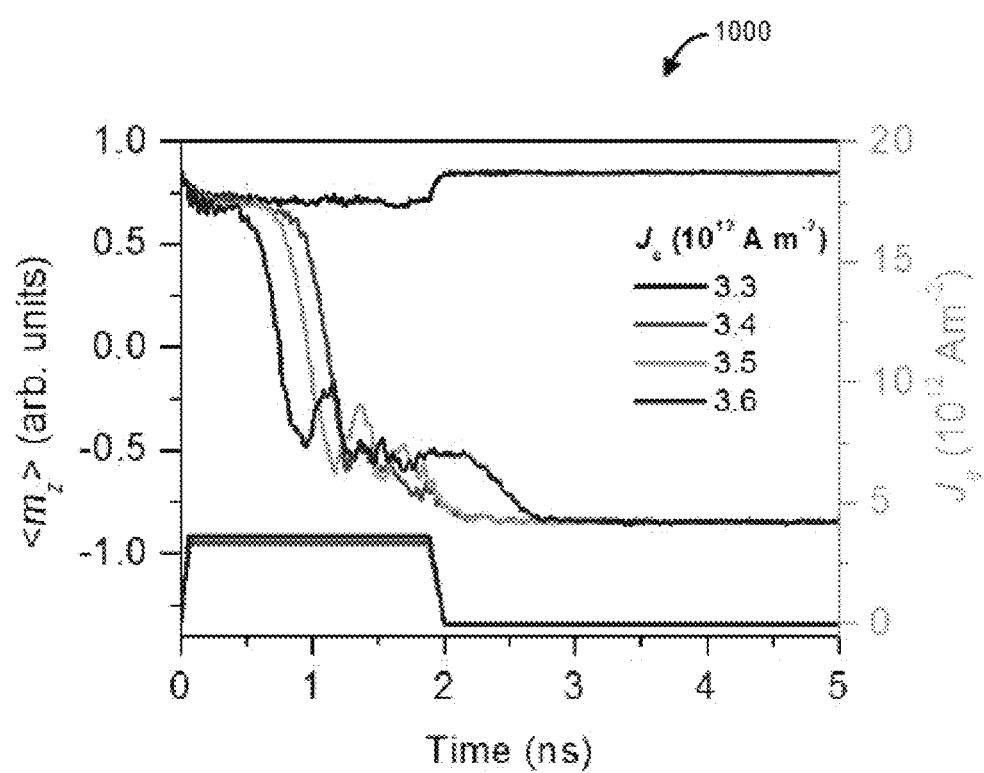
FIG. 10A is a graph of temporal trajectories of the $m_z$ with various $J_e$ for a of 0.025 with a 2-ns pulse at $H_x$=200 mT.
Figure 10B:
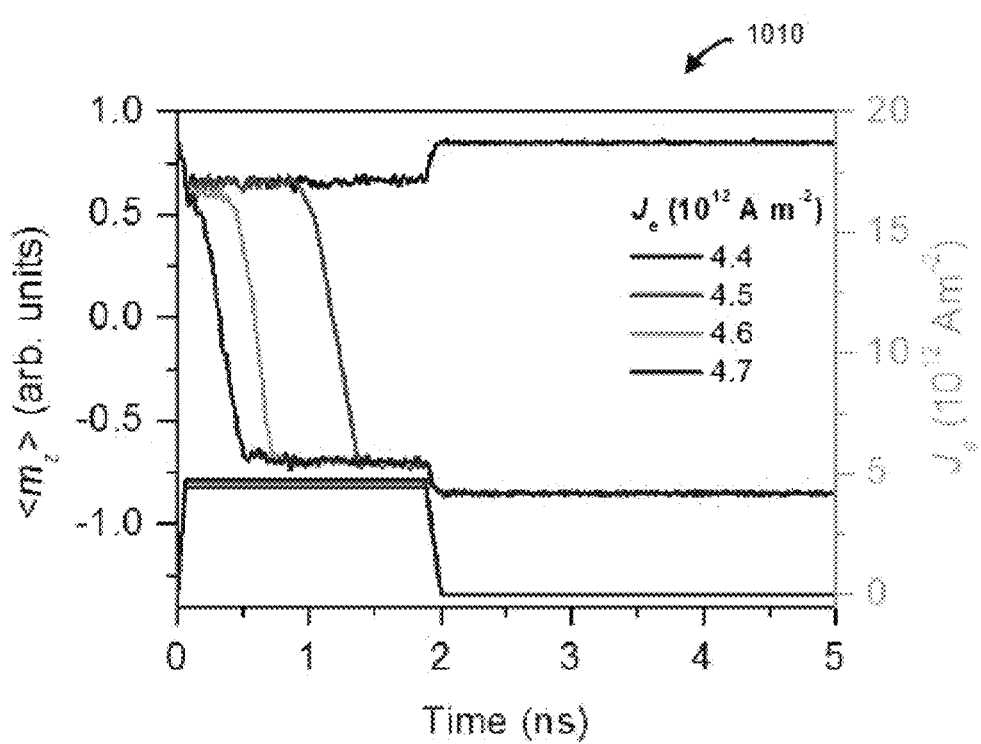
FIG. 10B is a graph of temporal trajectories of the $m_z$ with various $J_e$ for α of 0.1 with a 2-ns pulse at $H_x$=200 mT.

In addition, a higher damping constant and a rough boundary as well as an additional transverse in-plane assist field ($H_y$) in a ferromagnet can minimize the switching-back process, leading to more reliable switching. In case of a higher damping constant, the magnetization trajectory is more deterministic without switching-back. FIG. 10A is a graph 1000 of temporal trajectories of the $m_z$ with various $J_e$ for a damping constant ($\alpha$) of 0.025 with a 2-ns pulse at $H_x=200$ mT. FIG. 10B is a graph 1010 of temporal trajectories of the $m_z$ with various $J_e$ for a of 0.1 with a 2-ns pulse at $H_x=200$ mT. As can be seen, the higher damping constant helps to minimize switching back.

In conclusion, it should be understood that various adaptations and modifications may be made to the above discussed techniques. It should be appreciated that details included in the various example embodiments are merely provided for purposes of illustration, and are not intended to limit the scope, applicability, or configuration of the invention. For example, it should be understood that the various elements described above may be made from differing materials, implemented in different combinations or otherwise formed or used differently without departing from the intended scope of the invention.

What is claimed is:

1. A method for switching a magnetization direction of a ferromagnet (FM) layer of a spin orbit torque (SOT) device, comprising:
   applying an in-plane assist field; and
   applying one or more in-plane input current pulses each having a tuned pulse width or a pulse width selected to be within a range of tuned pulse widths, and an intensity, to switch the magnetization direction of the FM layer,
   wherein the tuned pulse width or range of tuned pulse widths are selected to avoid a specific pulse width that causes switch-back of the magnetization direction of the FM layer of the SOT device.

2. The method of claim 1, wherein the specific pulse width that causes switch-back is determined by physically testing the SOT device for each of a plurality of different pulse widths and one or more intensities or simulating the SOT device for each of the plurality of different pulse widths and one or more intensities.

3. The method of claim 1, wherein the in-plane assist field is in a direction of the in-plane input current pulses, and the method further comprises:
   applying additional in-plane assist field in a direction transverse to the direction of the in-plane input current pulses.

4. The method of claim 1, wherein the FM layer is part of a multilayer stack of the SOT device that includes a heavy metal (HM) layer, the FM layer, and a metal oxide layer.

5. The method of claim 1, wherein the SOT device is part of a magnetic random access memory (MRAM).

6. A method for producing a spin orbit torque (SOT) device having a ferromagnetic (FM) layer whose magnetization direction is reliably switched, comprising:
   determining operation in response to in-plane input current pulses having a plurality of different pulse widths and one or more intensities;
   based on the determining, identifying a specific pulse width that causes switch-back of the magnetization direction of the FM layer of the SOT device;
   selecting a tuned pulse width and intensity or a tuned range of pulse widths and intensity that avoid the specific pulse width that causes switch-back of the magnetization direction of the FM layer of the SOT device; and
   producing the SOT device to use in-plane input current pulses having the tuned pulse width and intensity or a pulse width selected to be within the range of tuned pulse widths and intensity, to switch the magnetization direction of the FM layer.

7. The method of claim 6, wherein the determining comprises:
   physically testing the SOT device for each of the plurality of different pulse widths and one or more intensities.

8. The method of claim 6, wherein the determining comprises:
   simulating the SOT device for each of the plurality of different pulse widths and one or more intensities.

9. The method of claim 6, further comprising:
   increasing a damping constant of the SOT device.

10. The method of claim 6, further comprising:
    roughening a boundary of the FM of the SOT device.

11. The method of claim 6, wherein the produced SOT device is further configured to apply an in-plane assist field in a direction of the in-plane input current pulses, and an additional in-plane assist field in a direction transverse to the direction of the in-plane input current pulses.

12. The method of claim 6, wherein the FM layer is part of a multilayer stack of the SOT device that includes a heavy metal (HM) layer, the FM layer, and a metal oxide layer.

13. The method of claim 6, wherein the SOT device is part of a magnetic random access memory (MRAM).

* * * * *